United States Patent [19]

Nacci

[11] 4,292,120
[45] Sep. 29, 1981

[54] PROCESS OF FORMING A MAGNETIC TONER RESIST USING A TRANSFER FILM

[75] Inventor: George R. Nacci, Wilmington, Del.

[73] Assignee: E. I. Du Pont de Nemours & Company, Wilmington, Del.

[21] Appl. No.: 139,110

[22] Filed: Apr. 10, 1980

[51] Int. Cl.³ .................... C23F 1/02; B05D 1/04; G03G 15/00

[52] U.S. Cl. .................... 156/660; 156/235; 156/289; 156/902; 156/904; 427/29; 427/98; 430/39; 430/126; 430/313; 430/318

[58] Field of Search ............. 156/634, 656, 660, 901, 156/902, 233, 235, 289, 904; 430/31, 39, 107, 126, 136, 313, 314, 315, 318, 319; 204/15, 32; 101/470; 118/621, 644; 427/12, 25, 29, 47, 48, 26, 27, 98; 346/74.1; 355/3 TR, 3 TE

[56] References Cited

U.S. PATENT DOCUMENTS

| | | | |
|---|---|---|---|
| 2,917,460 | 12/1959 | Solar | 430/31 UX |
| 2,947,625 | 8/1960 | Bertelsen | 156/660 X |
| 2,990,278 | 6/1961 | Carlson | 430/126 UX |
| 3,013,027 | 12/1961 | Ruzicka et al. | 260/397.4 |
| 3,061,911 | 11/1962 | Baker | 29/829 X |
| 3,120,806 | 2/1964 | Supernowicz | 101/426 |
| 3,441,938 | 4/1969 | Markgraf | 430/39 X |
| 3,469,982 | 9/1969 | Celeste | 430/286 X |
| 3,592,642 | 7/1971 | Kaupp | 430/31 UX |
| 3,650,860 | 3/1972 | Rolker | 156/656 |
| 3,762,944 | 10/1973 | Sloan et al. | 101/470 X |
| 3,791,823 | 2/1974 | Carreira | 430/126 X |
| 3,851,964 | 12/1974 | Smith et al. | 355/10 |
| 3,880,689 | 4/1975 | Rolker et al. | 156/233 |
| 3,965,478 | 6/1976 | Schloemann | 346/74.1 |
| 4,015,027 | 3/1977 | Buchan et al. | 427/25 UX |
| 4,067,018 | 1/1978 | Pond | 346/74.1 |

Primary Examiner—William A. Powell

[57] ABSTRACT

A process of forming an image of toner on a latent magnetic image in a magnetic imaging member followed by transfer to a heated transfer member. The transfer member is formed of a backing sheet coated with polyvinyl alcohol. The toner image is then transferred to a substrate using heat and pressure. The backing sheet portion of the transfer member is then stripped away and the polyvinyl alcohol is washed away with water. The surface portion of the substrate not protected by the transferred resist toner image is then permanently modified by etching or plating. Chemically milled shapes are prepared as well as printed circuits and printing plates. The printed circuits may be formed by (1) etching away areas of a metal surface not protected by the resist, (2) electroless plating on areas not protected by the resist or (3) electroplating areas of a metal surface not protected by the resist, removing the resist, and in the case of (2) and (3), etching away the metal previously covered by the resist. An especially useful toner which forms a resist composition comprises a binder of thermoplastic resin and plasticizer and magnetic material present in the binder, compounded to have a tack transfer temperature of no greater than 110° C.

9 Claims, 1 Drawing Figure

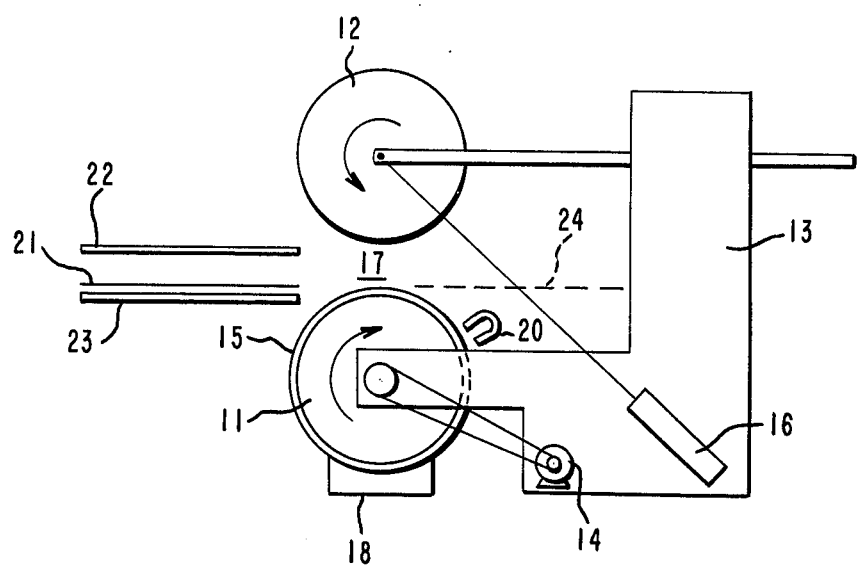

PROCESS OF FORMING A MAGNETIC TONER RESIST USING A TRANSFER FILM

TECHNICAL FIELD

The present invention is a process of transferring a magnetically-held magnetic toner image from a magnetic imaging member to a transfer member. The magnetic toner image is then applied to a substrate and the transfer member removed. The substrate is then permanently modified such as by etching or plating.

BACKGROUND ART

Printed circuits are commonly made by depositing a resist on a substrate either in the form of the desired pattern or as an overall covering followed by removal of some resist to form the desired pattern, followed by modification of the bare adjacent areas of the substrate through etching or plating.

Conventiional printing methods such as letterpress, lithography, and gravure printing have been found to be deficient for resist printing, however, because they are only capable of printing a thin resist. Thin resist patterns tend to be full of pinholes which lead to unacceptable quality upon subsequent etching or plating. This is a particularly severe problem in plating because of the formation of plating nodules over pinholes in the resist. Use of liquid photoresists presents the same problem.

Two methods are now in commercial use—screen printing and photoprinting—because they are able to deposit pinhole-free resist patterns. Photoprinting, as described in Celeste U.S. Pat. No. 3,469,982, requires the lamination and subsequent exposure and development of each substrate with a suitable photopolymer. While this process provides the highest quality resists and has many advantages, the expense of the materials and exposure and development steps detract from low cost rapid reproduction. Screen printing is low in ink cost but it requires a costly set-up for the master; furthermore, it has only been implemented as a flat-bed process requiring extensive operator interaction to maintain registration and correct ink viscosity. The screening also limits edge definition. Further, the process requires post-curing.

Attempts have been made to apply xerography (electrophotographic printing or imaging by electrostatically-held toner) to the resist art. By way of background in the xerography art, thermal transfer of electrostatic toner to paper has been practiced in the past. Generally, the heat was applied after the transfer of the toner, as described in U.S. Pat. Nos. 2,990,278; 3,013,027; 3,762,944; 3,851,964 and 4,015,027. Simultaneous heating and transfer of electrostatic toner to paper is disclosed in U.S. Pat. No. 3,592,642. U.S. Pat. No. 3,917,460 discloses the melting of the electrostatic toner on the paper surface so that the molten droplets so formed may be absorbed in the interstices of the paper to make a permanent image on the paper.

As applied to the resist art, however, xerography has taken a different approach. U.S. Pat. No. 2,947,625 discloses formation of an electrostaticallyheld image of toner, transfer of this image to a wet gelatin-coated paper using pressure which imbeds the toner in the gelatin coating, and exposing the toner image to the softening action of solvent vapors, and pressing the solvent vapor-softened toner image against a printed circuit board to transfer a stratum of the resultant tacky image to the board, and finally subjecting the transferred image to more solvent vapors or heat to coalesce the image, which is then purportedly available as an etching resist. U.S. Pat. No. 3,061,911 discloses a similar process except that the image is transferred from the transfer paper to the circuit board by electrical charging and the resultant transferred image is fused by exposure to solvent vapor. A transfer process has been commercialized, with only limited success, involving electrostatic transfer of an image of electrostatically held toner to a tissue, electrostatically transferring the image from this tissue to a circuit board, and fusing the image with solvent vapor.

In the magnetic printing art, U.S. Pat. No. 3,965,478 discloses preheating of paper to which an image of magnetic toner is transferred under pressure, followed by additional heating to melt the toner and cause it to become impregnated into the paper surface. U.S. Pat. No. 4,067,018 discloses that in order to get a high quality image on unheated paper, free of smearing or smudging, that one or at most $1\frac{1}{2}$ layers of magnetic toner particles should be adhered to the magnetic imaging member.

As applied to the circuit making art, U.S. Pat. No. 3,880,689 discloses the magnetic printing of catalyst-sensitized toner particles in a circuit pattern onto an adhesively-coated film, followed by electroless plating of the circuit pattern to form a printed circuit. This patent also discloses that the image can be printed onto a circuit board, but this would have the disadvantage of the existence of a toner layer between the electroless plating and the circuit board. U.S. Pat. No. 3,120,806 discloses the use of a magnetic pattern placed beneath a circuit board to attract fusible metal toner to the circuit board in the pattern of the magnetic pattern, to form the circuit directly therefrom.

As applied to the resist art, U.S. Pat. No. 3,,650,860 discloses a process for using magnetic toner to make a resist image. In this process, a magnetizable layer is deposited on the conductive metal substrate and this layer is imagewise heated above its Curie temperature to form a latent magnetic image in the layer. This is followed by applying a dispersion of a magnetic toner, made of ferromagnetic material dispersed in binder, in a solvent for the binder to the latent magnetic image and drying the dispersion, which thereby forms a resist corresponding to the latent magnetic image. The bare portion of the magnetizable layer and corresponding underlying conductive metal substrate can then be etched away to form a printed circuit of the remaining conductive metal substrate. Among the disadvantages of this process is the consumption of the magnetizable layer for each printed circuit made and the necessity to use solvent to convert the magnetic toner to a liquid medium and subsequent evaporation of the solvent.

DISCLOSURE OF THE INVENTION

The present invention provides a resist process involving magnetic imaging which overcomes shortcomings of the resist art, in having the advantage of a quick use time for the image master (magnetic member) which is not consumed in the process, providing thick, pinhole-free resist images, providing a high rate of forming transfer sheets containing such images, such as in a rotary press, utilizing a stable material requiring no performance monitoring by an operator and providing high quality resist images with excellent edge definition.

The present invention also provides resist compositions and apparatus which are especially useful in the process of this invention.

The process of the present invention involves forming a magnetically held image of toner and transferring this image to a transfer member by means of heat and pressure. The heat is supplied to the process by preheating the transfer member receiving the toner. Surprisingly, the transferred toner forms an image on said transfer member which is useful as a resist in such processes as making printed circuit boards, printing plates, or in chemical milling, i.e., the process can involve the steps of (a) decorating a magnetic imaging member with toner particles preferably by the wet process, (b) transferring the thus formed magnetically held image of coalescible magnetic toner particles from the magnetic imaging member to a preheated transfer member formed of a sheet coated with a water soluble polymer to form a coalesced resist image on the water soluble polymer coating, (c) applying the side of the transfer member containing the image of coalescible toner particles to a preheated suitable surface to form a resist image, (d) removing the sheet portion of the transfer member, (e) washing away the water soluble polymer, (f) optionally modifying the exposed areas of the surface which are unprotected by the resist image, and (g) optionally removing the resist image from the surface-modified product. The modification can be to make the exposed surface hydrophilic or hydrophobic, opposite to the characteristics of the resist image, in which case the resultant product could be used as a lithographic printing plate. The modification can be to etch or deposit a metal on the exposed surface of the substrate to form the desired electrical circuit as a network of metallic conductors on an insulating background of suitable dimensions. In chemical milling (etching), the interconnecting metallic network is either self-supporting or it may be attached to a suitable substrate.

The toner composition used in the present invention is comprised of magnetic particles, which are individually encapsulated in a coalescible polymer binder, dispersed in a liquid vehicle. The particulate resist composition is composed of particles having an average size up to 30 $\mu$m for substantially instantaneous application to a heated surface of metal or the like to form a resist image capable of withstanding liquid treatment media for said surface, comprising (a) binder consisting essentially of a thermoplastic resin and up to 40% based on the weight of said binder of plasticizer for said resin, and (b) magnetic material in particulate form present in said binder rendering the particles of said composition magnetically attractible, the combination of said binder and said magnetic material being substantially non-blocking at 20° C. and being adherent to said surface upon said application to said metal surface and coalescible thereon to form said resist image, said magnetic material constituting from 40 to 80% by weight of the combination of (a) and (b) and said binder constituting the remainder.

The transfer member is a support sheet of material having a softening point above 50° C. and preferably above 100° C., to avoid softening in the process. The support sheet is coated with a layer of a water soluble polymer such as polyvinyl alcohol, carboxy-methyl cellulose, gelatin, etc. The support sheet can be made of any suitable material including paper and metal but generally the sheet will be a film of a thermoplastic material such as polyester or a polyamide. Because of its lower cost and excellent dimensional stability, polymesters and particularly poly(ethylene terephthalate) are preferred. Generally the support sheet will be from 5 to 500 $\mu$m and preferably from 10 to 250 $\mu$m in thickness. Above about 250 $\mu$m and especially above about 500 $\mu$m the support sheet becomes stiff, unwieldy, and unduly expensive. Below about 10 $\mu$m and especially below about 5 $\mu$m the support sheet becomes too limp and flexible to handle readily and does not have enough heat storage capacity to operate as the heat sink in the step of transferring of toner from the magnetic imaging member to the transfer member. Generally the polyvinyl alcohol layer is from 1 to 40 $\mu$m and preferably from 1 to 20 $\mu$m in thickness. Above about 20 $\mu$m and especially above about 40 $\mu$m in thickness it takes too long to wash away the polyvinyl alcohol layer. Below about 1 $\mu$m in thickness it is too difficult to coat and not thick enough to get good adherence of the toner. The polyvinyl alcohol is used because of its solubility in water and because it does not soften on heating, and because it has excellent adhesion to support sheets and particularly polyester support sheets at 100° C. and poor adhesion at 25° C.

The apparatus of the present invention can be described as follows:

Apparatus for forming a resist image onto a circuit board comprising means for defining a movable magnetic member for incorporating a latent magnetic image for development by toner, means for heating the surface of a transfer member, means for moving the heated transfer member and magnetic member together and pressing the heated surface of said transfer member against the developed latent magnetic image during said movement to transfer said image to said heated surface to form a resist image on said heated surface, said heating means being positioned just upstream of said moving and pressing means.

BRIEF DESCRIPTION OF THE DRAWING

The FIGURE is a schematic side view of the apparatus used for forming a resist image according to the present invention.

DETAILED DESCRIPTION OF INVENTION AND BEST MODE

The steps in the process of the invention may be understood by referring to the drawing which illustrate schematically the magnetic printing and thermal transfer machine used in most examples of the invention.

Referring now to the drawing, two rolls, 11 and 12, each five inches (12.7 cm) in width and in diameter are mounted one above the other in a metallic frame, 13. The lower roll, 11 is referred to as the printing roll, and it can be rotated by means of a variable speed drive motor, 14. The printing roll is surfaced with magnetic member 15 which is a film consisting of a layer of hard (permanent) magnetic material such as discussed below on a polyethylene terephthalate film support and is backed with a thin layer of resilient material such as neoprene. The upper roll, 12, is referred to as the pressure roll. It is movable and is fitted with a piston device, 16, which controls the pressure exerted by roll 12 on the printing roll, 11, and forms the nip, 17, in operation.

The desired circuit design is imaged to form a magnetic image in magnetic member 15. The imaged film can also be referred to as the movable printing member. Alternatively, the printing may be carried out with an endless belt of the magnetic member material adapted to be pressed against the transfer member by a roll similar to roll 11, which endless belt would be kept taut about roll 11 by one or more additional rolls.

Below the printing roll, a toner applicator, 18, is attached which is used to maintain a dispersion of magnetic toner in a liquid vehicle in contact with magnetic member 15.

A transfer member composite, 21, is preheated between hot plates, 22 and 23, just upstream from the nip between the rolls in the diagram. The hot transfer member is pushed into the nip, 17, between rolls 11 and 12. The transfer member is rolled through the nip so that is comes into momentary contact with and moves together with the decorated magnetic member, so that toner is pressed against the transfer member and is adhesively transferred to the transfer member. The transfer member containing the toner image emerges to the right of the nip, as indicated by 24.

Magnetic Member and Imaging Thereof

A printing member such as an endless belt, flexible film or platen is provided with a surface capable of containing a magnetic image. The magnetic material forming the surface generally will be a particulate hard magnetic material in a binder. Suitable hard magnetic materials include the permanent magnetic materials such as the "Alnicos", the "Lodexes" (acicular iron-cobalt alloys encased in lead or plastic and manufactured by General Electric Company), the "Indox" barium ferrite compositions, and materials used in tape recording, magnetic discs, and magnetic printing inks. These latter materials include $\gamma$-iron oxide ($Fe_2O_3$), magnetite (black $Fe_3O_4$), $\chi$-iron carbide and chromium dioxide. Acicular chromium dioxide is generally preferred because of its magnetic properties. The magnetic member preferably is a drum in which case the imaging surface may be an integral part of the drum or it may be a flexible film coated with the magnetic material and mounted on the drum.

Any method for forming a latent magnetic image in the magnetic member is useful in the present invention. The image is latent in the sense that it is not visible to the naked eye until decorated with magnetic toner which develops the image.

When using thermal imaging to create the latent magnetic image, the surface is magnetically structured by one of several methods with from about 100 to 3000 magnetic lines per inch (39.4 to 1180 per cm) and preferably from 150 to 600 magnetic lines per inch (59.1 to 236.2 per cm). As used herein, a magnetic line contains one north pole and one south pole. The technique of roll-in magnetization can be used to structure the surface of the magnetic member, wherein a high permeability material such as nickel, which has been physically discretely structured to the desired width is placed in contact with the surface of the magnetic member, which previously has been magnetized in one direction by a permanent magnet or a DC electromagnet, and a DC electromagnet or permanent magnet with the polarity reversed is placed on the backside of the permeable material. As the structured high permeability material is brought into contact with the magnetic member, the nickel or other permeable material concentrates the magnetic flux lines at the points of contact causing polarity reversal at these points and resulting in a structured magnetization of the magnetic member.

The surface of the magnetic member can also be thermoremanently structured by placing the magnetic member having a continuously coated surface of magnetic material on top of a magnetic master recording of the desired periodic pattern. An external energy source then heats the surface of the magnetic member above its Curie temperature. As the surface of the magnetic member cools below its Curie temperature, the periodic magnetic signal from the magnetic master recording thermoremanently magnetizes it. When acicular chromium dioxide is used as the magnetic material in the surface of the magnetic member, as little as 20 oersteds can be used to structure the surface of the magnetic member when passing through the Curie temperature whereas over 200 oersteds are needed to apply detectable magnetism to acicular chromium dioxide at room temperature.

Alternatively the latent magnetic image can be created in the magnetic member by means of a magnetic write head. The magnetic write head can provide the requisite magnetic structuring in the latent magnetic image directly.

The magnetic member used in the Examples is a layer of acicular chromium dioxide particles in a binder coated on a polyester film which is aluminumbacked or aluminized.

The thickness of the $CrO_2$ layer on the film is limited only by the ability of the layer to absorb sufficient thermal energy to effectively demagnetize the $CrO_2$ layer by raising a given thickness of the said layer above the Curie point of 118° C. during the thermal imaging process. Thicker layers are preferred to enhance magnetic field strength. Practically, the thickness of the $CrO_2$ layer on the imaging member is from 50 to 2000 microinches (1.27 to 50.8 micrometers), and is preferably from 150 to 500 microinches (3.81 to 12.7 micrometers).

The magnetic member can be used either mounted in the form of a endless belt supported by a plurality of rolls or mounted to the curved printing roll 11. The imaging and toning steps are separate entities which do not need to be done consecutively in predetermined sequential fashion. For instance, it may be desired to mount a preimaged magnetic member on the printing roll.

The magnetic member can be imaged in a variety of ways, either held flat or attached to the curved printing roll. One form of the master image is a silver photographic image transparency of a printed circuit diagram. This is held in contact with a prestructured magnetic member and flashed with a Xenon flash tube. The energy transmitted through the transparent parts of the master raises the $CrO_2$ above its Curie temperature of 118° C. and demagnetizes it; the opaque parts of the design minimize energy transmission and the design remains as a latent image on the $CrO_2$ film if excessive flash energy is avoided. Alternative procedures are to scan the desired circuit designs onto the printing member having no prestructure with electromagnetic recording heads, or to selectively demagnetize prestructured areas of the magnetic member with point sources of radiation, e.g., lasers, which heat selected areas of the magnetic member to above the Curie temperature of the magnetic material in the magnetic member. These devices may be designed to respond in an on-off fashion to a computer-stored or computer-aided design.

Precise image registration is important when the process of the present invention is used to form both singlesided and double-sided circuit boards or to chemically mill double-sided patterns or shapes on metal.

Decoration and Transfer to the Transfer Member

Rotation of the drum past a toner reservoir decorates the latent magnetic image with a magnetic toner to form a toner image which consists of multiple layers of toner. By multiple layers of toner it is meant that at least two layers of toner particles are applied to the latent magnetic image in the magnetic member on the surface of the drum. This is necessary so that sufficient toner is available in the transferred image to form a coalesced (hole-free) resist image on the final substrate surface. Multiple layers of toner particles of the latent magnetic image are achieved by control of toner particle size so that excessively large particles are not present and by having sufficient field strength of the magnetic member and sufficient concentration of magnetizable material in the toner.

A wet toner seems preferable to a dry toner, since thicker toner images are possible: 0.8 mils for dry—1.- 2–1.4 mils for wet. The toned images are rinsed with a solution of wetting agent in water and then air dried.

The transfer member is uniformly preheated to a suitable temperature. The transfer member not only has the capability of being uniformly preheated but has sufficient heat capacity to retain this uniformity of heating sufficiently to make the toner uniformly adhere to the substrate in the transfer step.

Rotation of the drum decorated with multiple layers of toner in rolling contact with the preheated transfer member using a pressure roll surprisingly effects simultaneous transfer and adhesion of virtually all of the multiple layers of the toner image to the transfer member in an adhesive transfer step and this is accomplished without loss of image fidelity. The transferred image may be either a positive or a negative resist, depending upon the master design and provides high fidelity reproduction of this design.

Imaging, decoration and transfer first to the transfer member and then to a substrate are separate operations which may be, but are not necessarily immediately consecutive reactions. In magnetic printing of circuit boards, the magnetic image of a particular design can ordinarily be preserved after preparation and used any number of times to prepare multiple copies of identical circuit boards, either in a single run or intermittently. More importantly, the distinguishing feature of the present invention is that transfer members decorated with toner resists can be prepared at one location and used as resists either intermittently or elsewhere.

An important feature of this invention is that successful transfer and faithful reproduction of the desired image is accomplished without adhesion of softened toner or polyvinyl alcohol to the magnetic member.

Adhesion of toner particles can be accomplished by a combination of heat and pressure. The simultaneous application of heat and pressure is the preferred method of adhesive transfer in this invention. An essential characteristic of the transfer process is that application of heat to the toner particles is from the transfer member which causes the toner to adhere to the transfer member, but not to the magnetic member while the transfer step is carried out.

Binder components of toners have a temperature range over which they tackify, i.e., soften and adhere to the transfer member sufficiently to be pulled away from the gripping force of the latent magnetic image, but do not adhere to the magnetic member under the conditions of transfer. If the resin component becomes truly fluid, loss of image definition occurs by smearing of the transferred image and/or by a portion of the toner remaining adhered to the magnetic member. It is essential that the toner resin be solid before transfer, rapidly become tacky at the transfer nip because pressure at the nip is applied only for a moment (substantially instantaneous tack), and maintain image definition.

Transfer by tackifying, or adhesive transfer, is subject to the important variables of temperature, printing (transfer) speed, stored heat and nip pressure. Adhesive transfer temperature is critical since this is a dynamic physical process. It is related to the physical properties of the toner resin. In general, the transfer temperature may be from about 40° C. to 150° C. depending on the melting point and melt viscosity of the resin binder and nip pressure. The preferred range is from about 125° C. to about 140° C. for the resin used in the examples. This is illustrated for specific cases in the examples which follow; these examples are non-limiting with respect to the transfer conditions. The lower operating limit is based solely on the necessity of having a non-tacky fluidizable toner at room temperature. Although a lower temperature might be operable, ambient storage temperature might rise sufficiently to cause such toner to block or coalesce into large particles on standing. The upper limit is also related to the Curie temperature of the magnetic material in the magnetic member. In the case of $CrO_2$, the Curie temperature is about 118° C. but a transfer temperature somewhat above this value can be employed since the process is dynamic and the momentary heating of the magnetic member by the heated substrate at the pressure nip coupled with the insulating effect of the toner can effectively prevent the surface of the magnetic member from reaching the Curie temperature. Of course, when using magnetic materials having higher Curie temperatures, higher temperatures may be used.

Generally speaking, the shorter the contact time, the higher the temperature that should be used. Conversely, increasing contact time by decreasing printing speed can result in lowering the transfer temperature. Depending on the temperature range, the printing speed generally is more than 1 ft/min (0.5 cm/sec) preferably from 5 to 150 ft/min (2.54 to 76.20 cm/sec) and more preferably from 10 to 120 ft/min (5.08 to 60.96 cm/sec).

Contact pressure may vary considerably. Generally when using a roll, a pressure of from 5–100 pounds per linear inch (pli) (0.89–17.8 kg/cm) will be used. Higher pressures may be used but transfer pressure is eventually limited by the danger of embossing of the magnetic member. Pressure serves to ensure firm contact and to enhance consolidation of the coalescing toner. The multiple layers of toner particles necessary for this consolidation and coalescence to a resist image presents the problem of achieving this result without also losing image fidelity.

The time of application of pressure to transfer the toner to the transfer member should be momentary in order to achieve the highest fidelity resist image. Preferably, this time is no greater than one second and more preferably no greater than 0.1 second.

A key feature for the successful operation of the printing machine is the existence of a temperature differential between the surface of the transfer member and the magnetic member since the temperature of the surface of the magnetic member should not reach the point at which the toner will tackify and stick to the magnetic member. The precise temperature, of course, is related to the toner resin itself and the operating conditions. Some resistance to sticking can be obtained by optional application of release agents such as "Slipspray Dry Lubricant" (Du Pont) or "RTV" Silicone rubber (GE) to the surface of the magnetic member without destroying the ability of the latent magnetic image to pick up toner particles.

The present invention provides a sharp, well defined thick layer of toner in the form of a coalesced resist image on the heated transfer member surface receiving the toner from the magnetic imaging member.

Transfer to the Substrate

The toner image is transferred to the final substrate by pressing the side of the transfer member containing the toner image against a preheated substrate. For example, the toner image-containing transfer member can be rolled against the preheated substrate. Again the transfer temperature may be from about 40° C. to 150° C. depending on the melting point and melt viscosity of the resin binder. The preferred range is about 125° C. to 140° C. for the resin used in the Examples. The general features of adhesive transfer discussed previously apply to this transfer step also.

The substrate is then cooled to approximately room temperature, 20°–25° C. At these temperatures the adhesion of the polyvinyl alcohol coating to the poly-(ethylene terephthalate) film is not good and the poly-(ethylene terephthalate) film can be easily peeled away leaving the magnetic resist/polyvinyl alcohol film on the substrate. The polyvinyl alcohol film is washed away with water leaving the magnetic toner resist pattern on the substrate.

The success of the present invention is surprising for several reasons, among them being the following. First, the surface of the substrate, e.g. metal or plastic, is smooth relative to the surface of paper, i.e., no interstices are present, and the toner adheres sufficiently to the surface to withstand subsequent modification of the surface such as by etching. Second, the resist image is a high fidelity reproduction of the original or desired image despite having been formed under heat and pressure from multiple layers of toner on the latent image of the magnetic member. Third, all of the multiple layers of toner, as required to avoid discontinuities in the resist image, are transferred to the transfer member upon only momentary application of pressure on toner particles just then being subjected to heat by the transfer member. Fourth, the image of toner particles can be efficiently transferred from the transfer member directly to the substrate surface, e.g., printed circuit board, on which the image is to serve as a resist by simply applying heat and pressure, the polyvinyl alcohol layer has low adhesion to the sheet portion so that the sheet can be removed by simple stripping and the polyvinyl alcohol can be removed from the substrate surface by washing wih water.

The resist image formed of coalesced toner protects the underlying areas of the substrate surface according to the master design. The unprotected areas are then modified, preferably permanently, by such processes as etching, electroplating or electrolessly plating. In the print and etch mode of manufacture, the unprotected areas are etched away and the resist image is subsequently stripped to expose the underlying metal, e.g. printed circuitry, if desired.

In another embodiment of the present invention, the circuit board substrate onto which the magnetically held image is transferred is capable of being selectively plated with electrically conducting material. The resist image must be thick enough to minimize pinhole formation and preferably should be thick enough to provide channels deep enough to contain the thickness of the plating. Significant overplating (mushroom effect) of plated metal beyond the circuit lines onto the resist image is generally prevented when a 0.4 mil (0.0102 mm) or more thickness of resist is present.

Either a negative of a positive image may be printed onto a circuit board composite for subsequent conventional circuit board preparation. A positive resist image is defined as one which leaves the circuit lines exposed. The product may be subsequently treated by optionally plating the exposed lines with copper and then plating with a material such as solder which is resistant to etchants such as ferric chloride. The resist may be removed and the newly exposed substrate removed by etchants to form the printed circuit. Copper is conveniently etched with ferric chloride.

Ferric chloride or other etchants may be used for chemical milling; this is a deep etching method which avoids the stresses of mechanical milling. If a negative resist image is defined as one which covers the circuit lines with resist, the treatment consists of etching or chemically removing the exposed substrate and, if desired, removing the resist image, and if desired thickening the exposed circuit lines by plating may subsequently be done.

Product

The above process forms a printed circuit board, which is an electrical circuit in the form of a network of metallic conductors on an insulating background of suitable dimensions.

The conductive layer may be mounted on inert nonconductive base materials and the toner resist defining the circuit lines printed magnetically on one side only, or a circuit board having a conductive layer on both sides may be printed with complimentary designs which require accurate registration of the toner resist on both sides. In both cases, undesired material in the conductive layer may be removed by etching.

Chemical milling by etching is an alternative process to mechanically milling a desired pattern since mechanical milling tends to leave strains in the metal.

Suitable materials, including alloys, for magnetic printing substrates are the structural metals which include but are not limited to copper, silver, aluminum, stainless steel, magnesium, duraluminum, tin, lead, nickel, chromium, iron-nickel-cobalt alloys such as "Kovar" and "Alloy 42", and beryllium copper, which may or may not be supported on a suitable electrically insulating base material, depending upon the desired application of the end product. Chemically milled samples are unsupported, whereas printed circuit boards are usually used in supported form. Providing a support allows the use of a thinner layer of electrically conducting material.

Copper is the preferred metal for the electrically conducting material for printed circuit boards because of its good thermal and electrical conductivity in relation to cost. Iron-nickel-cobalt alloys such as "Kovar" and "Alloy 42", beryllium copper, duraluminum, aluminum and stainless steel are preferred substrates for chemical milling applications.

For circuit boards in which a metal layer is laminated to an insulating base, suitable insulating base materials include vulcanized fiber, mica, glass, asbestos, cotton, glass fiber, polyester, aromatic polyamide, cellulose, aromatic polyimide and mixtures of these with one another, preferably bonded into a laminate with a thermosetting phenolic resin or an epoxy resin or mixtures thereof.

Advantages of the Present Invention Over Other Methods of Preparing Printed Circuit Boards (1) The present invention provides a better quality resist on metallic substrates than is possible with electrophotographic printing. This is because all of the toner in the electrophotographic process has the same electrical charge (either positive or negative) which causes the toner particles to tend to repel each other even though they are attracted to the metallic substrate. This has a tendency to cause pinholes which is a particularly serious problem when plating on the metallic substrate to form a printed circuit board. Electrophotographic systems also require constant reforming of the latent electrostatic image after transfer of the substrate. The electrophotographic process, therefore, is time-consuming and the product circuit boards are typically of low quality.

(2) The present invention does not suffer from the distortion of image dimensions observed with screen printing. In screen printing, the design is prepared on screens of stainless steel wire, nylon, polyester or metalized polyester fibers held in a steel frame. Repetitive off-contact printing with these screens causes screen distortion with every pass of the squeegee. Eventually, the registration of the design is lost and the screen must be prepared again. This is costly in terms of time and materials, particularly since screen preparation is time-consuming.

(3) The present invention overcomes the disadvantage of offset lithography, namely, thin coatings full of pinholes which require more than one pass. Offset lithography also requires a careful balance to be maintained between the emulsified ink resist and water and drying of the printed resist image which could entrap dust during drying.

(4) Thick, well defined (sharp break between resist and substrate surface), dense, uniform coatings of resist of thicknesses up to 2.0 mils (0.0508 mm) and preferably 0.8 to 1.4 mil (0.0203 to 0.0356 mm) can be deposited. This thickness is sufficient to avoid pinholing and prevent conductor spreading by most overplating. Further, these thick coatings result in toner layers which can cover or "tent" holes in the circuit board of diameter 90 mils or more.

The process of the present invention has the capability of preparing printed circuit boards having both conductor area uniformity and conductor line edge quality much superior to those previously prepared by direct printing using fusible dust or adhesive and metal dust or electrostatic or xerographic printing. The process of the present invention also has the capability of preparing printed circuit boards having conductor line edge quality superior to those previously prepared by screening, in that the conductor lines do not have undesired "nicks" in them as often occurs in screening. Offset printing is capable of printing sharp lines but cannot produce the pinholefree resist needed for etching or plating.

The process of this invention can also be used to prepare printing plates for both planographic and relief printing. The use of an oleophilic toner transferred to a hydrophilic support, e.g., aluminum lithographic printing plate, will produce directly a lithographic plate which will accept ink in the toned areas. Alternatively, the use of a hydrophilic toner applied to a hydrophobic plastic or metallic, e.g., copper, support, will provide a lithographic plate which will accept ink in the areas free of toner. A wide variety of plate making procedures may be employed by depending on the use of the coalesced toner image as a resist. For example, a hydrophobic coalesced toner image may be used for the manufacture of deep etch as well as bimetallic and trimetallic planographic plates. Further, coalesced toner images can be used in all the conventional methods of preparing letterpress plates by photoengraving, e.g., etching zinc, copper, or magnesium with powdering or powderless etching methods, and duplicates can be made in the form of stereotypes, electrotypes, plastic, or rubber plates. In addition, coalesced toner images made by the process can be used to prepare gravure printing plates with wells of variable area and constant depth.

SPECIFIC EMBODIMENTS OF THE INVENTION

The following illustrative examples demonstrate ways of carrying out the invention. The invention is not restrictive or limited to these specific examples. All parts and percentages are by weight, and all temperatures are Centigrade, unless otherwise noted.

EXAMPLE 1

A 450 μin (11.4 μm) $CrO_2$ coating on 500D aluminized Mylar ®, poly(ethylene terephthalate) film, was magnetically recorded with a 200 cycle/in (~80 cycle/cm) sine wave. A Xenon flash unit was used to expose the $CrO_2$ film to a circuit board test pattern thereby imagewise demagnetizing the $CrO_2$ film. The $CrO_2$ film was developed in a magnetic toner bath comprised of 10 g of magnetic toner dispersed in 500 g $H_2O$ containing 2 g Fluorad ® FC-128 wetting agent dispersing agent. The magnetic toner was comprised of 50% wt Atlac ® 380E polyester resin purchased from ICI, Ltd. and 50% wt $Fe_3O_4$. The toned image was rinsed with a solution comprised of 2 g Fluorad ® FC-128 wetting agent in 500 cc of $H_2O$ and then air dried.

A 500D Mylar ®, poly(ethylene terephthalate) film, was coated with Slipspray ® and buffed. The film was dip coated at 1"/sec (2.54 cm/sec) in a 4% wt Elvanol ® 51-05 polyvinyl alcohol aqueous solution and dried at 25° C. The dried polyvinyl alcohol coating thickness was 0.5 mils (12.7 μm).

The $CrO_2$ tones film was mounted on the print roll of the toner transfer machine of the FIGURE and the toner transferred to the polyvinyl alcohol coated poly(ethylene terephthalate) film described above at 10 lb load and at a speed of 6"/sec (15.2 cm/sec). The preheat temperature of the polyvinyl alcohol coated poly(ethylene terephthalate) was 140° C.

A 1 oz copper clad circuit board was dip coated with 2% benzotriazole in acetone and dried. The circuit board was preheated to 140° C. and the magnetic toner image on the polyvinyl alcohol coated poly(ethylene terephthalate)film was rolled onto the copper clad circuit board. The board was cooled to 25° C., the poly(ethylene terephthalate) film peeled away, and the polyvinyl alcohol film then washed away with water, leaving the magnetic toner image on the copper circuit board.

EXAMPLE 2

Same as Example 1 except the toner image was transferred to copper circuit boards with 1/16" (1.6 mm) diameter holes to demonstrate that "tenting" is possible with this process.

EXAMPLE 3

Same as Example 1 except that the polyvinyl alcohol coated poly(ethylene terephthalate) film was not coated first with Slipspray ®.

Transfer of toned image to Elvanol ® coated Mylar ® was accomplished at 50 lb load and 125° C. Transfer from the polyvinyl alcohol coated poly(ethylene terephthalate) film was to copper circuit board (*not* benzotriazole coated) at 125° C.

EXAMPLE 4

A 450 μin (11.4 μm) $CrO_2$ coating on 500D aluminized Mylar ®, poly(ethylene terephthalate) film, was magnetically recorded with a 200 cycle/in (~80 cycle/cm) sine wave. A Xenon flash unit was used to expose the $CrO_2$ film to a circuit board test pattern thereby imagewise demagnetizing the $CrO_2$ film. The $CrO_2$ film was developed in a magnetic toner bath comprised of 10 g of magnetic toner dispersed in 500 g $H_2O$ containing 2 g Fluorad ® FC-128 dispersing agent. The magnetic toner was comprised of 50% wt Atlac ® 380E polyester resin purchased from ICI, Ltd. and 50% wt $Fe_3O_4$. The toned image was rinsed with a solution comrpised of 2 g Fluorad ® FC-128 wetting agent in 500 cc of $H_2O$ and then air dried.

A 500D Mylar ®, poly(ethylene terephthalate) film, was coated with 4% Elvanol ®51–05 polyvinyl alcohol in $H_2O$ by dip coating at 1"/sec (2.54 cm/sec) and dried at 25° C.

The $CrO_2$ toned film was mounted on a 3" (7.62 cm) diameter roll covered with foam rubber ¼" (0.62 cm) thick and rolled with a 10 lb total load onto polyvinyl alcohol coated poly(ethylene terephthalate) film described above at 135° C. at 6"/sec (15.2 cm/sec). The magnetic toner image on the polyvinyl alcohol coated poly(ethylene terephthalate) film was rolled against a 1 oz copper clad circuit board preheated to 125° C. After cooling the board to 25° C., the poly(ethylene terephthalate) film was peeled away and the polyvinyl alcohol was then washed from the toner image with cold water, leaving the magnetic toner image on the copper circuit board.

I claim:

1. A process comprising forming a magnetically held image of coalescible magnetic toner particles, bringing this image into contact with the water soluble polymer coated surface of a heated transfer member comprising a sheet coated with water soluble polymer under pressure to transfer said image to the surface of the transfer member, transferring the image under heat and pressure to a substrate surface to form a resist image thereon corresponding to the magnetically held image, cooling the substrate and stripping away the sheet portion of the transfer member, washing the water soluble polymer off the substrate surface.

2. The process of claim 1 wherein the transfer member is formed from a sheet of material having a softening point above 50° C. and is from 10 to 250 μm in thickness, and the exposed areas of the substrate surface are modified.

3. The process of claim 2 wherein the water soluble polymer is polyvinyl alcohol and the polyvinyl alcohol coating in the transfer member is from 1 to 20 μm in thickness.

4. The process of claim 3 wherein the substrate is a structural metal or a dielectric containing a catalyst for electroless plating and the exposed surface of the substrate is placed with metal.

5. The process of claim 4 wherein the resist is at least 0.0127 mm in thickness.

6. The process of claim 5 wherein the substrate is metal.

7. The process of claim 3 wherein the substrate is metal which is chemically milled to form a predetermined shape in the modifying step.

8. The process of claim 3 wherein the substrate is a metal layer mounted on a dielectric layer and a printed circuit is formed in the modifying step.

9. The process of claim 3 wherein the substrate surface is metal and a metal is deposited on at least part of the substrate not protected by the toner image in the modifying step.

* * * * *

UNITED STATES PATENT AND TRADEMARK OFFICE
CERTIFICATE OF CORRECTION

PATENT NO. : 4,292,120
DATED : Sep. 29, 1981
INVENTOR(S) : George R. Nacci

It is certified that error appears in the above—identified patent and that said Letters Patent is hereby corrected as shown below:

Column 14, line 31, "placed" should read -- plated --.

Signed and Sealed this

Fifth Day of January 1982

[SEAL]

Attest:

GERALD J. MOSSINGHOFF

*Attesting Officer*     *Commissioner of Patents and Trademarks*